(12) United States Patent
Ding et al.

(10) Patent No.: US 8,879,666 B2
(45) Date of Patent: Nov. 4, 2014

(54) ELECTRONIC SYSTEM, RF POWER AMPLIFIER AND TEMPERATURE COMPENSATION METHOD THEREOF

(71) Applicants: Universal Scientific Industrial (Shanghai) Co., Ltd., Shanghai (CN); Universal Global Scientific Industrial Co., Ltd., Nantou County (TW)

(72) Inventors: Jaw-Ming Ding, Taoyuan County (TW); Wei-Hsuan Lee, New Taipei (TW); Wen-Tou Chiu, Taoyuan (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 18 days.

(21) Appl. No.: 13/792,984

(22) Filed: Mar. 11, 2013

(65) Prior Publication Data

US 2014/0153670 A1 Jun. 5, 2014

(30) Foreign Application Priority Data

Nov. 30, 2012 (TW) .............................. 101145009 A

(51) Int. Cl.
| | |
|---|---|
| *H04L 25/49* | (2006.01) |
| *H03F 1/30* | (2006.01) |
| *H03F 1/32* | (2006.01) |
| *H03F 3/189* | (2006.01) |
| *H03F 3/24* | (2006.01) |
| *H03F 3/45* | (2006.01) |

(52) U.S. Cl.
CPC ................. *H03F 1/32* (2013.01); *H03F 3/189* (2013.01); *H03F 3/24* (2013.01); *H03F 3/45183* (2013.01); *H03F 3/45475* (2013.01); *H03F 2203/45496* (2013.01); *H03F 2203/45528* (2013.01); *H03F 2203/45694* (2013.01)

USPC ........................... 375/297; 330/256; 330/272

(58) Field of Classification Search
CPC ........... H03F 1/30; H03F 1/301–1/307; H03F 2200/447
USPC ................................... 375/297; 330/256, 272
See application file for complete search history.

(56) References Cited

U.S. PATENT DOCUMENTS

| | | | | |
|---|---|---|---|---|
| 6,194,968 | B1 * | 2/2001 | Winslow ....................... | 330/289 |
| 7,358,807 | B2 * | 4/2008 | Scuderi et al. ................ | 330/140 |
| 2005/0030101 | A1 * | 2/2005 | Ichitsuho et al. ............. | 330/285 |
| 2005/0118965 | A1 * | 6/2005 | Tanabe et al. .............. | 455/127.1 |
| 2005/0186922 | A1 * | 8/2005 | Nakayama ................... | 455/126 |
| 2006/0182197 | A1 * | 8/2006 | Godambe et al. ............. | 375/297 |

* cited by examiner

*Primary Examiner* — Kevin Kim

(74) *Attorney, Agent, or Firm* — Li & Cai Intellectual Property (USA) Office

(57) ABSTRACT

A radio frequency (RF) power amplifier is disclosed. The RF power amplifier includes an adder circuit, an output-stage circuit and a differential circuit. The adder circuit has a first ratio and a second ratio, and receives a reference voltage and a feedback voltage so as to output an adder voltage after an operation, wherein the feedback voltage is a voltage with a negative temperature coefficient, and the reference voltage is sum of a first voltage with a negative temperature coefficient and a second voltage with positive temperature coefficient. The output-stage circuit is used for providing the feedback voltage. The differential circuit has a first multiplier factor, and the differential circuit makes the first multiplier factor be multiplied with the adder voltage so as to provide a voltage to the output-stage circuit. The RF power amplifier stabilizes an output current through adjusting the temperature coefficient of the reference voltage.

20 Claims, 5 Drawing Sheets

ELECTRONIC SYSTEM, RF POWER AMPLIFIER AND TEMPERATURE COMPENSATION METHOD THEREOF

BACKGROUND OF THE DISCLOSURE

1. Field of the Disclosure

The present disclosure relates to a radio frequency (RF) power amplifier; in particular, to a RF power amplifier with temperature compensation.

2. Description of Related Art

In a wireless hand-held communication device, a main direct current (DC) power consumption comes from a RF power amplifier. Therefore, to keep a high linearity of the RF power amplifier without an amplified signal being distorted and to maintain a high efficiency to support a long time of communication has always been a focus in designing the RF power amplifier. In particular, there is an obvious characteristic of a time-dependent wave packet when a broadly used digital modulation technique of orthogonal frequency-division multiplexing (OFDM) is adopted in a wireless communication system, and a constant of peak to average power ratio (PAPR) of which is way higher than that of the current wireless communication system; in other words, the variation of the wave packet with time is more dramatic, and thus a demand of the linearity of the RF power amplifier is higher.

In the prior arts, a bandgap reference circuit used as a bias circuit in a power amplifier is able to provide a reference voltage with a close to zero temperature coefficient; however, as a transistor in the power amplifier is a bipolar junction transistor and which results in a characteristic of a negative temperature coefficient of a current gain, and the current gain (Beta) decreases with an increasing temperature, and further leads to a problem of reducing in output current and output power; therefore, there is a secret worry that a low linearity of power amplifier leads to the amplified signal being distorted.

SUMMARY OF THE DISCLOSURE

The present disclosure provides a RF power amplifier, the RF power amplifier includes an adder circuit, an output-stage circuit, and a differential circuit. The adder circuit has a first ratio and a second ratio, and the adder circuit receives a reference voltage and a feedback voltage so as to output an adder voltage after an operation, wherein the feedback voltage is a voltage with a negative temperature coefficient, and the reference voltage is a sum of a first voltage with a positive temperature coefficient and a second voltage with a negative temperature coefficient, and the adder voltage is a sum of the reference voltage multiplied by the first ratio and the feedback voltage multiplied by the second ratio. The output-stage circuit is coupled to the adder circuit, and the output-stage circuit is used for providing the feedback voltage. The differential circuit is electrically coupled to the adder circuit, and the differential circuit has a first multiplier factor, for a use of making the adder voltage received be multiplied with the first multiplier factor so as to provide the output voltage to the output-stage circuit. When the reference voltage is a voltage with a zero temperature coefficient, an input current will be a current with a zero temperature coefficient; or, when the reference voltage is a voltage with a positive temperature coefficient and a ratio constant of an input current to an output current of the output-stage circuit has a characteristic of negative temperature coefficient, the output current is a current with a zero temperature coefficient.

The present disclosure another provides an electronic system. The electronic system includes a RF power amplifier and a load. The RF power amplifier receives a RF input signal and outputs a RF output signal. The load is coupled to the RF power amplifier, and the load receives a RF output signal outputted by the RF power amplifier.

The present disclosure further provides a temperature compensation method.

In the embodiments of the present disclosure, the electronic system, the RF power amplifier, and the temperature compensation method thereof are able to provide a temperature compensation effect, which stabilizes the output power and the output current of the power amplifier even under a temperature variation, and further maintains a high linearity so as not to distort the amplified signal.

For further understanding of the present disclosure, reference is made to the following detailed description illustrating the embodiments and examples of the present disclosure. The description is only for illustrating the present disclosure, not for limiting the scope of the claim.

BRIEF DESCRIPTION OF THE DRAWINGS

For further understanding of the present disclosure, reference is made to following accompany drawings, and in the following accompany drawings.

DETAILED DESCRIPTION OF PREFERRED EMBODIMENTS

Figure 1:
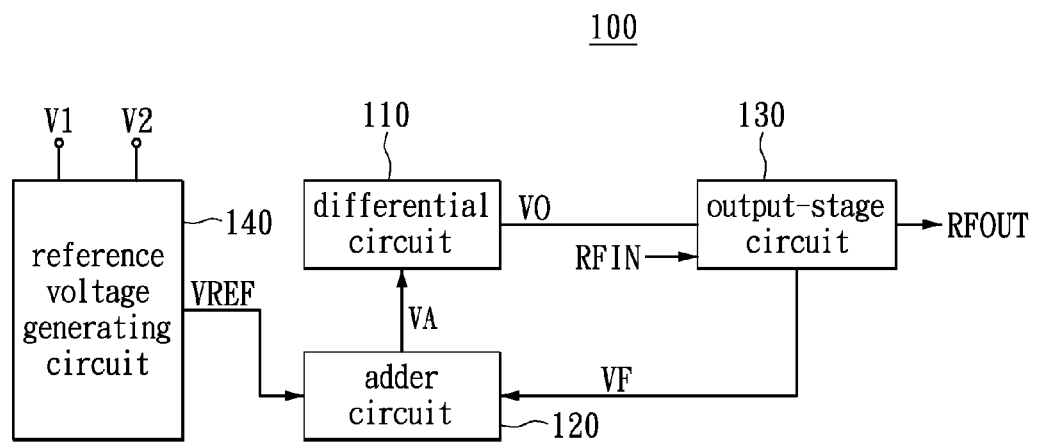
FIG. 1 shows a schematic diagram of a RF power amplifier according to an embodiment of the instant disclosure.

Referring to FIG. 1, FIG. 1 shows a schematic diagram of a RF power amplifier 100 according to an embodiment of the instant disclosure. As shown in FIG. 1, the RF power amplifier 100 includes a differential circuit 110, an adder circuit 120, an output-stage circuit 130, and a reference voltage generating circuit 140.

In the present embodiment, the adder circuit 120 has a first ratio and a second ratio, and the adder circuit 120 receives a reference voltage VREF and a feedback voltage VF, and the adder circuit 120 receives the reference voltage VREF and the feedback voltage VF and outputs an adder voltage VA after an operation, wherein the adder voltage VA is a sum of the reference voltage VREF multiplied by the first ratio and the feedback voltage VF multiplied by the second ratio. The feedback voltage VF is a voltage with negative temperature coefficient, and the reference voltage VREF is a sum of a first voltage V1 with a positive coefficient and a second voltage V2 with a negative temperature coefficient.

The output-stage circuit 130 is used for providing the feedback voltage VF with the negative temperature coefficient to the adder circuit 120. In other words, the RF power amplifier 100 feeds back the feedback voltage VF to the adder circuit 120 from the output-stage circuit 130 through a feedback mechanism. Under an alternating current (AC) signal mode, the output-stage circuit 130 receives a RF input signal RFIN and outputs a RF output signal RFOUT to a next-stage circuit block (not shown in FIG. 1), wherein an input terminal of the output-stage circuit 130 has an input matching circuit (not shown in FIG. 1), and an output terminal of the output-stage circuit 130 has an output matching circuit (not shown in FIG. 1) to provide a higher power matching efficiency.

The differential circuit 110 has a first multiplier factor, for a use of a multiplication operation. The differential circuit 110 makes the adder voltage VA received be multiplied by the first multiplier factor so as to provide an output voltage VO to the output-stage circuit 130. The differential circuit 110 and the adder circuit 120 may be combined as an operation circuit, and the operation circuit operates an addition performed by the adder circuit 120 first, then operating a multiplication performed by the differential circuit 110. Among the above, the reference voltage generating circuit 140 may be a bandgap reference circuit, which outputs the reference voltage VREF with the positive temperature coefficient or the zero temperature coefficient by adjusting a resistor value or a physical parameter of an element inside.

In another embodiment, it may be further designed according to a designing or actual application demand, and when a reference voltage VREF is a voltage with a zero temperature coefficient, an input current of the output-stage circuit 130 will be a current with the zero temperature coefficient; or, when the reference voltage VREF is a voltage with a positive temperature coefficient and a ratio constant of the input current to an output current of the output-stage circuit 130 has a characteristic of negative temperature coefficient, then the output current is a current with the zero temperature coefficient. Accordingly, the instant disclosure is able to stabilize the input current or the output current of the RF power amplifier 100, and further maintain a high linearity of the RF power amplifier 100.

In the instant disclosure, the positive temperature coefficient indicates that there is a proportional relationship between physical quantities (such as the voltage value, the current value, and the resistor value) and the temperature; which means, when the temperature increases or decreases, the physical quantities increases or decreases with the temperature; the negative temperature coefficient indicates that there is an inverse relationship between the physical quantities and the temperature; the zero temperature coefficient indicates that the relationship between the physical quantities (such as the voltage value, the current value, and the resistor value) and the temperature is irrelevant, which means, when the temperature increases or decreases, the physical quantities do not increase or decrease with the temperature.

Continuously referring to FIG. 1, the RF power amplifier 100 uses the adder circuit 120 to receive the reference voltage VREF generated from the reference voltage generating circuit 140, and the adder circuit 120 receives the feedback voltage VF with the negative temperature coefficient from the output-stage circuit 130. Afterwards, the adder circuit 120 performs an addition operation on the reference voltage VREF and the feedback voltage VF; which means, the adder circuit 120 makes the reference voltage VREF be multiplied by the first ratio and also makes the feedback voltage VF multiplied by the second ratio, and then performs an addition operation to get a sum of the former resulted values, and then, the adder circuit 120 transmits a final result (i.e. the adder voltage VA) to the differential circuit 110 to perform a multiplication operation.

After the differential circuit 110 receives the adder voltage VA, the differential circuit 110 makes the adder voltage VA be multiplied by the first multiplier factor, and transmits an operation result (i.e. an output voltage VO) to the output-stage circuit 130. In the present embodiment, the first ratio is equal to the second ratio, and a sum of the first ratio and the second ratio is equal to 1, and the first multiplier factor is a reciprocal of the first ratio or a reciprocal of the second ratio. Therefore, the operation result is that the output voltage VO is a sum of the reference voltage VREF and the feedback voltage VF. As shown in equations as follows, wherein a1 is the first ratio; a2 is the second ratio, and m1 is the first multiplier factor.

$$VA=(a1\times VREF)+(a2\times VF) \quad (1)$$

$$a1=a2 \quad (2)$$

$$a1+a2=1 \quad (3)$$

$$VO=m1\times VA=VREF+VF \quad (4)$$

Furthermore, in an embodiment, the output-stage circuit 130 is a bipolar junction transistor (BJT). A base of the bipolar junction transistor receives the output voltage VO and a RF input signal RFIN; a collector of the bipolar junction transistor is coupled to a system voltage, outputting an output current and a RF output signal; an emitter of the bipolar junction transistor is coupled to a ground voltage, wherein a ratio constant of the output current to the input current is Beta ($\beta$) with a negative temperature coefficient, and which means a current gain; moreover, a base-emitter voltage of the bipolar junction transistor is a voltage with a negative temperature coefficient, wherein a feedback voltage VF is a base-emitter voltage of the bipolar junction transistor; and as a result, the feedback voltage VF of the output voltage VO counterbalances the base-emitter voltage of the bipolar junction transistor; in other words, the output voltage VO is equal to the reference voltage VREF. When the designer adjusts the reference voltage VREF as a voltage with a positive temperature coefficient, the input current of the bipolar junction transistor will be a current with the positive temperature coefficient; therefore, the output current of the bipolar junction resistor will be close to or equal to a current with a zero temperature coefficient.

In another embodiment, if an advancing manufacture process allows a temperature coefficient of a current gain ($\beta$) to be close to a zero temperature coefficient, then the designer is able to adjust the reference voltage VREF to be as a voltage with a zero temperature coefficient, and thus an input current and an output current of the bipolar junction transistor will both be the currents with the zero temperature coefficient.

Figure 2:
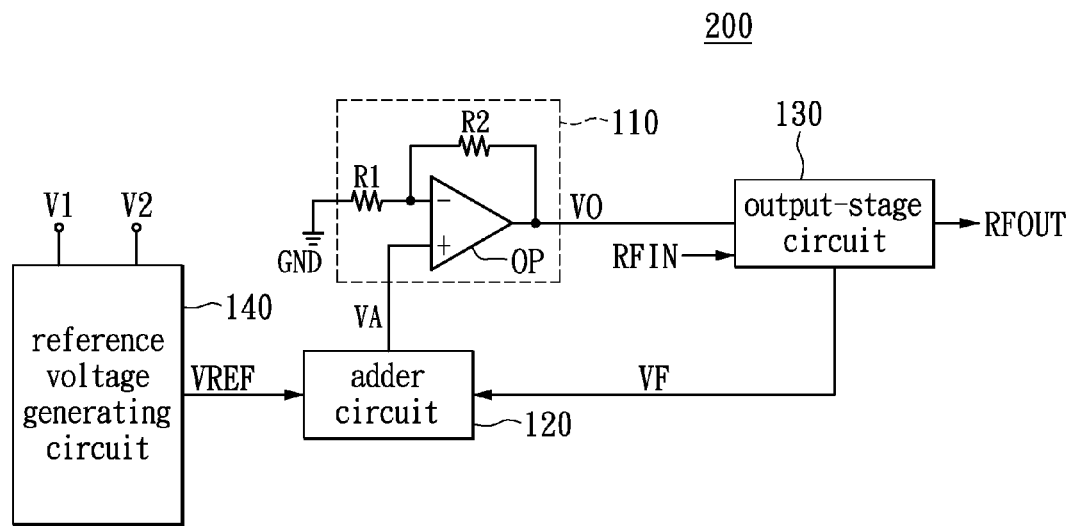
FIG. 2 shows a schematic diagram of a RF power amplifier according to another embodiment of the instant disclosure.

For specific instruction in how the differential circuit 110 performs a multiplication operation. Referring to FIG. 2, a differential circuit 110 includes an amplifier OP, a first resistor R1, and a second resistor R2. The amplifier OP has a positive input terminal and a negative input terminal, wherein the positive input terminal is coupled to an adder circuit 120 to receive an adder voltage VA. A terminal of first resistor R1 is coupled to a ground voltage GND, and another terminal of the first resistor R1 is coupled to the negative input terminal of the amplifier OP. A terminal of the second resistor R2 is coupled to the negative input terminal of the amplifier OP, while another terminal of the resistor R2 is coupled to an output terminal of the amplifier OP. The output terminal of the amplifier OP provides an output voltage VO to an output-stage circuit 130. A first multiplier factor is a resistor value of the second resistor R2 divided by a resistor value of the first resistor R1, as shown in Equation (5):

$$m1=R2/R1 \quad (5)$$

In the present embodiment, a configuration of the amplifier OP is a non-inverting feedback amplifier. Therefore, when the negative input terminal of the amplifier OP receives the adder voltage VA transmitted from the adder circuit 120, the amplifier OP performs a multiplication operation on the adder circuit 120; which means that the amplifier makes the adder voltage VA be multiplied by a first multiplier factor (m1), and then outputs the output voltage VO to the output-stage circuit 130. It is worth mentioning that, in the present embodiment, the resistor value of the first resistor R1 is equal to the resistor value of the second resistor R2, and the first ratio and the second ratio of the adder circuit 120 are both equal to ½, and thus the output voltage VO is equal to a sum of the reference voltage VREF and the feedback voltage VF.

In the following embodiments, only the content different from the embodiment in the FIG. 2 is recited, and the omitted parts are indicated to be identical as the above, and similar numbers or symbols refer to elements which are alike.

Figure 3:
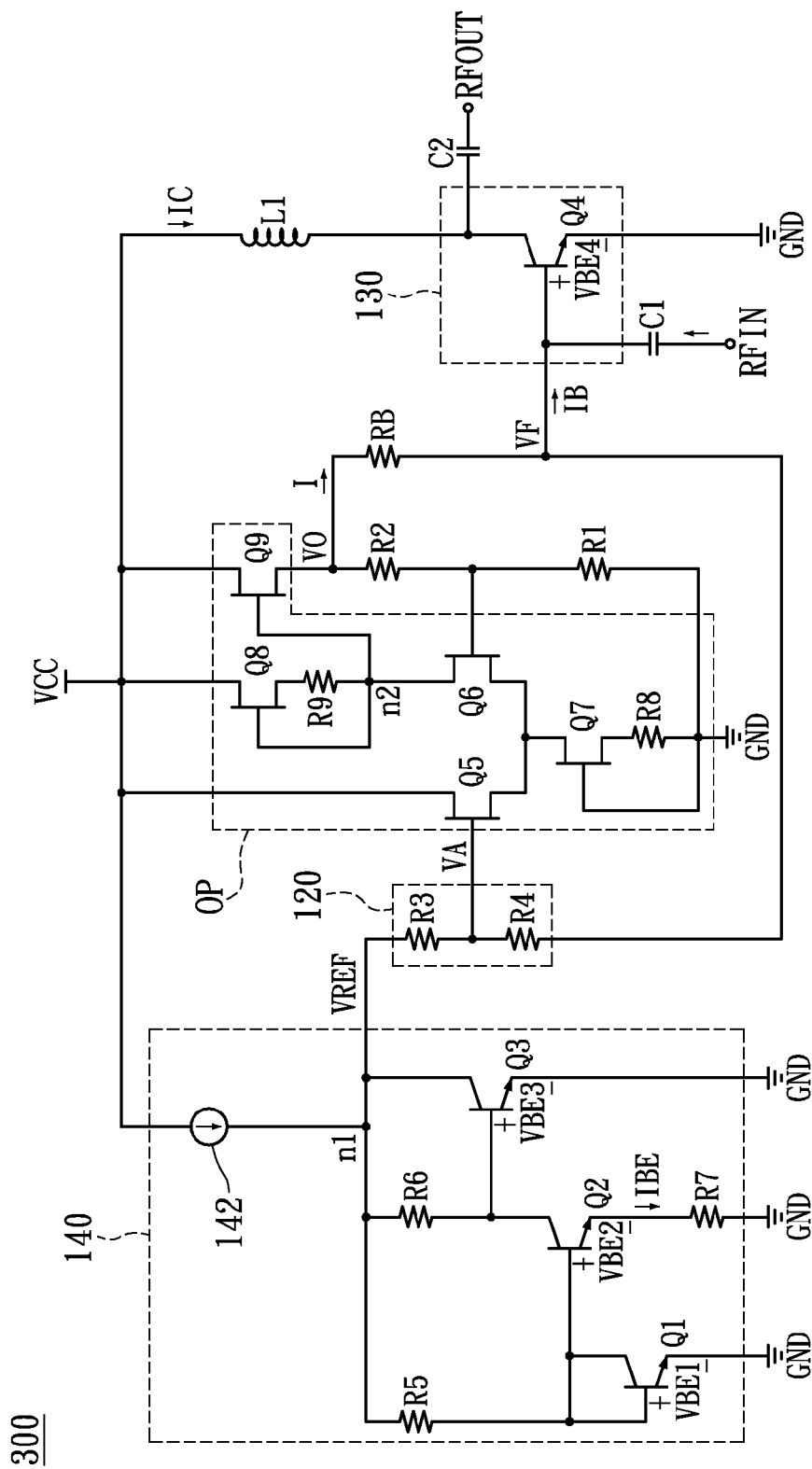
FIG. 3 shows a detailed circuit diagram of the RF power amplifier according to the embodiment of the instant disclosure.

Referring to FIG. 3, different from the embodiments in FIGS. 1-2, in the present embodiment, an adder circuit 120 includes a third resistor R3 and a fourth resistor R4. A reference voltage generating circuit 140 includes a first transistor Q1, a second transistor Q2, a third transistor Q3, a fifth resistor R5, a sixth resistor R6, a seventh resistor R7, and a current source 142. The output-stage circuit 130 includes a fourth transistor Q4. The amplifier OP includes a fifth transistor Q5, a sixth transistor Q6, a seventh transistor Q7, a eighth transistor Q8, a ninth transistor Q9, an eight resistor R8, and a ninth resistor R9, wherein in the present embodiment, the transistors Q5-Q9 are pseudo high electron mobility transistors (p-HEMT), and the transistors Q5 and Q6 are enhancement-type transistors, while the transistors Q7 and Q8 are depletion-type transistors; the transistor Q9 may be either an enhancement-type transistor or a depletion-type transistor. In another embodiment, transistors Q5-Q9 may be consisted of any kind of transistors which are with a gallium arsenide manufacture process such as effect transistors (FET), heterojunction bipolar transistors (HBT), or bipolar field effect transistors (BiFET), and thus it is not limited thereto.

A terminal of the fourth resistor R4 is coupled to the third resistor R3, and another terminal of the resistor R4 receives a feedback voltage VF, wherein a first ratio is equal to a resistor value of the fourth resistor R4 divided by a total resistor value, and a second ratio is equal to a resistor value of the third resistor R3 divided by the total resistor value, wherein the total resistor value is a sum of the resistor value of the third resistor R3 and the resistor value of the fourth resistor R4.

As for the reference voltage generating circuit 140, an emitter of the first transistor Q1 is coupled to a ground voltage GND, wherein the first transistor Q1 has a base-emitter voltage VBE1 with a negative temperature coefficient. A base of the second transistor Q2 is coupled to a base of the first transistor Q1, wherein the transistor Q2 has a base-emitter voltage VBE2 with a negative temperature coefficient. A terminal of the fifth resistor R5 is coupled to a first node n1, while another terminal of the resistor R5 is coupled to a collector and the base of the transistor Q1, wherein the first node n1 outputs a reference voltage VREF to the adder circuit 120. A terminal of the sixth resistor R6 is coupled to the first node n1, while another terminal of the sixth resistor R6 is coupled to a collector of the second transistor Q2. A terminal of the seventh resistor R7 is coupled to an emitter of the second transistor Q2, while another terminal is coupled to the ground voltage GND, and the seventh resistor R7 is used to generate a base-emitter voltage-difference current IBE with a positive temperature coefficient. Among the above, through adjusting resistor values of the sixth resistor R6 or the seventh resistor R7, a temperature coefficient of the reference voltage VREF is adjusted. A base of the third transistor Q3 is coupled to another terminal of the sixth resistor R6, and a collector of the third transistor Q3 is coupled to the first node n1, and the emitter of the third transistor Q3 is coupled to the ground voltage GND, wherein a base-emitter voltage VBE3 of the third transistor Q3 is a second voltage. A terminal of the current source 142 is coupled to a system voltage VCC, another terminal is coupled to the first node n1, and a current of the current source 142 flows from the system voltage VCC to the first node n1, wherein the first voltage is equal to a base-emitter voltage-difference current IBE multiplied by the resistor value of the sixth resistor R6.

As for the output-stage circuit 130, a collector of the fourth transistor Q4 is coupled to the system voltage VCC, and an emitter of the fourth transistor Q4 is coupled to the ground voltage GND, and a base of the fourth transistor Q4 is coupled to the output voltage VO, wherein the fourth transistor Q4 has a base-emitter voltage VBE4 with a negative temperature coefficient. A ratio constant of an output current IC to an input current IB of the fourth transistor Q4 is a current gain with a negative temperature coefficient, and the base-emitter voltage VBE4 of the fourth transistor Q4 is a feedback voltage VF.

A gate of the fifth transistor Q5 is a positive input terminal, used to receive the adder voltage VA, and a drain of the fifth transistor Q5 is coupled to the system voltage VCC. A gate of the sixth transistor Q6 is a negative input terminal, coupled to a terminal of the second resistor R2, and a source of the sixth transistor Q6 is coupled to a source of the fifth transistor Q5. A drain of the seventh transistor Q7 is coupled to the source of the transistor Q5, and a gate of the transistor Q7 is coupled to the ground voltage GND, wherein the seventh transistor Q7 is a depletion-type transistor. A terminal of the eighth resistor R8 is coupled to the source of the seventh transistor Q7, another terminal is coupled to the ground voltage GND. A gate of the transistor Q8 is coupled to a drain of the sixth transistor Q6, and a drain of the eighth transistor Q8 is coupled to the system voltage VCC, wherein the eighth transistor Q8 is a depletion-type transistor. A terminal of the ninth resistor R9 is coupled to a source of the eighth transistor Q8, while another terminal of the ninth resistor R9 is coupled to the drain of the sixth transistor Q6. A base of the ninth transistor Q9 is coupled to another terminal of the ninth resistor R9, and a drain of the ninth transistor Q9 is coupled to the system voltage VCC, and a source of the ninth transistor Q9 provides the output voltage VO to the output-stage circuit 130, wherein the ninth transistor Q9 is a depletion-type transistor, used as a buffer transistor to isolate interference.

The RF power amplifier 300 further includes a base resistor RB. A terminal of the base resistor RB receives the output voltage VO, while another terminal of which is coupled to the base of the transistor Q4.

The transistors Q1-Q3, the resistors R5-R7, and the current source 142 consists a typical kind of a bandgap reference voltage, and the base-emitter voltage VBE1 of the transistor Q1, the base-emitter voltage VBE2 of the transistor Q2, the base-emitter voltage VBE3 of the transistor Q3 are the voltages with a negative temperature coefficient. A voltage across two terminal of the seventh resistor R7 is a voltage with a positive temperature coefficient; which means, the voltage across two terminal of the seventh resistor R7 is equal to the base-emitter VBE1 of the transistor Q1 minus the base-emitter VBE2 of the transistor Q2, and thus the base-emitter voltage-difference current IBE passing the seventh resistor R7 is the voltage across two terminal of the seventh resistor R7 divided by the resistor value of the seventh resistor R7, as shown in Equation (6), and the base-emitter voltage-difference current IBE is a current with a positive temperature coefficient. Furthermore, under a condition of neglecting the base current of the transistors Q1-Q3, the first voltage is the base-emitter voltage-difference current IBE multiplied by the resistor value of the sixth resistor R6, and the second voltage is the base-emitter voltage VBE3, as shown in Equation (7).

$$IBE = (VBE1 - VBE2)/R7 \quad (6)$$

$$VREF = IBE \times R6 + VBE3 \quad (7)$$
$$= V1 + V2$$

In an embodiment, when the designer through adjusts resistor values of a sixth resistor R6 and a seventh resistor R7 to result in a reference voltage VREF to be a voltage with a positive temperature coefficient, and an input current IB of the transistor Q4 will be a voltage with a positive temperature coefficient, and which further results in an output current IC to be a current with a positive temperature coefficient. When the designer makes the resistor values of the resistors R1-R4 be equal to each other, then a first ratio and a second ratio will both be equal to ½, and a first multiplier factor is equal to 2. Moreover, when an adder circuit 120 receives the reference voltage VREF and a feedback voltage VF, the adder circuit 120 outputs an adder voltage VA to a gate of a fifth transistor Q5, wherein the adder voltage VA is as shown in Equation (8). Afterwards, under an operation (the adder voltage VA multiplied by a first multiplier factor) performed by the transistors Q5-Q8 and resistors R8-R9, there is a voltage generated in a node n2, wherein a eighth transistor Q8 and a ninth resistor R9 are used as a bias voltage current source, and a seventh transistor Q7 and a eighth resistor R8 are used as a bias voltage current source as well. Then, the voltage is transmitted to a gate of the ninth transistor Q9. The ninth transistor Q9 is configured as a voltage follower, and used as a buffer transistor to isolate noise from power source. Therefore, the source of the ninth transistor Q9 outputs an output voltage VO as shown in Equation (9). In addition, a volume of the voltage outputted by the node n2 is actually equal to the output voltage VO outputted by a source of the ninth transistor Q9.

$$VA = (1/2) \times VREF + (1/2) \times VF \quad (8)$$

$$VO = 2 \times [(1/2) \times VREF + (1/2) \times VF] \quad (9)$$
$$= VREF + VF$$

Afterwards, there is a current I with a positive temperature coefficient generated through a base resistor RB, part of the current (i.e. the input current IB) flows to a base of a fourth transistor Q4, wherein the input current IB is also the current with a positive temperature coefficient. Since the feedback voltage VF is equal to a base-emitter voltage VBE4 of the fourth transistor Q4, the current I is shown as Equation (10). Then, since the current gain ($\beta$) is with a negative temperature coefficient, and a relation of the input current IB and the output current IC of the fourth transistor Q4 is as shown in Equation (11); therefore, the output current IC of the fourth transistor Q4 will be a current with a close to or equal to zero temperature coefficient. It is worth noticing that an absolute value of a slope of the positive temperature coefficient of the input current IB has to be close to or equal to the absolute value of a slope of the negative temperature coefficient of the current gain ($\beta$) so as to achieve a better temperature compensation effect of the output current IC or the output power.

$$I=(VO-VBE4)/RB \quad (10)$$

$$IC=(\beta) \times IB \quad (11)$$

Among the above, the feedback voltage VF and the base-emitter voltage VBE4 perform a balancing operation so that there is only the reference voltage VREF in the output voltage VO, and thus the reference voltage VREF may be further adjusted to be with a positive temperature coefficient or a zero temperature coefficient for an actual application demand.

Figure 4A:
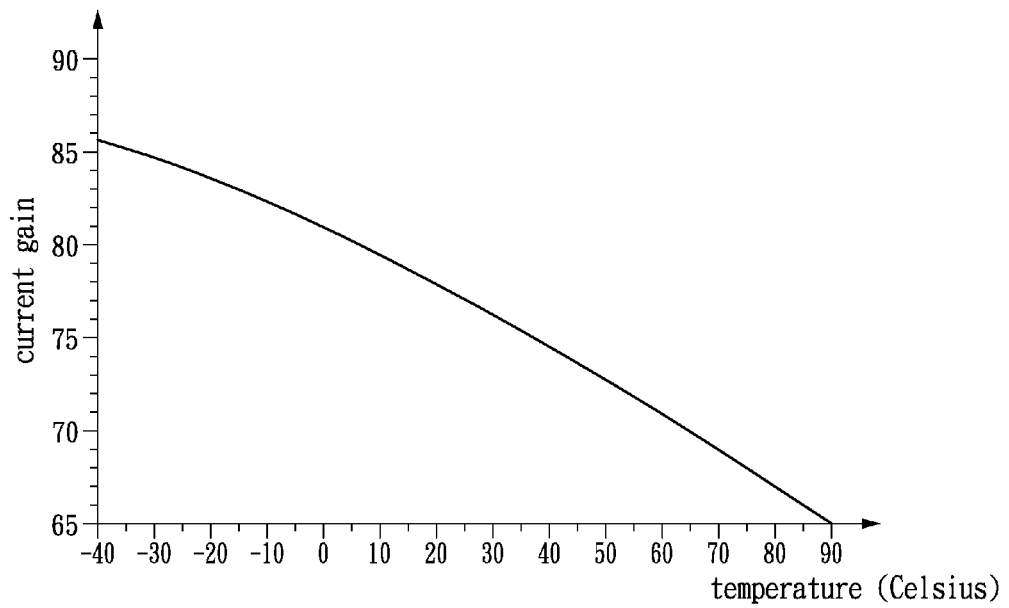
FIG. 4A-4C show simulation curve diagrams corresponding to FIG. 3.
Figure 4B:
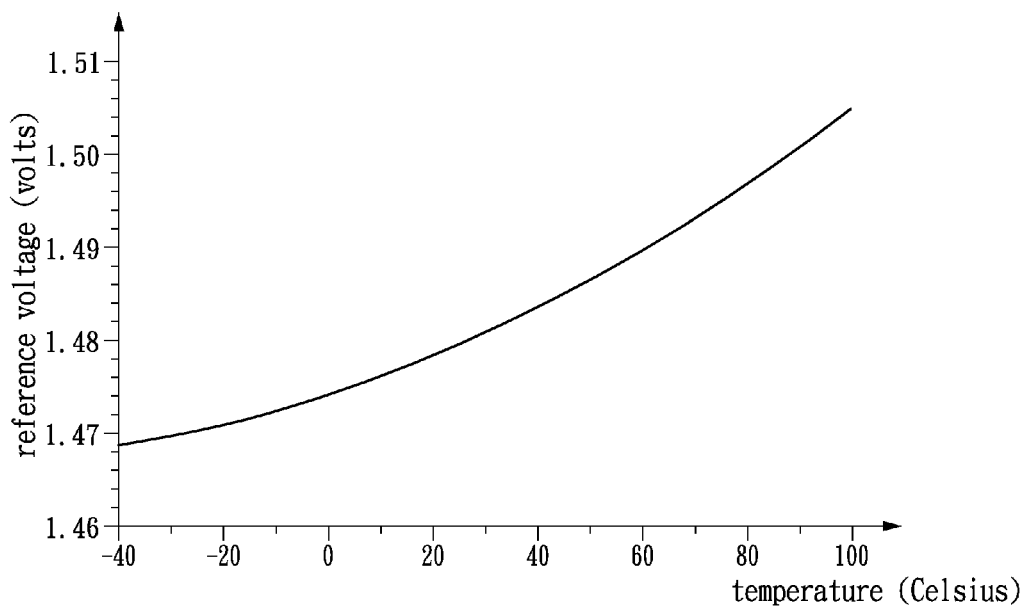
Figure 4C:
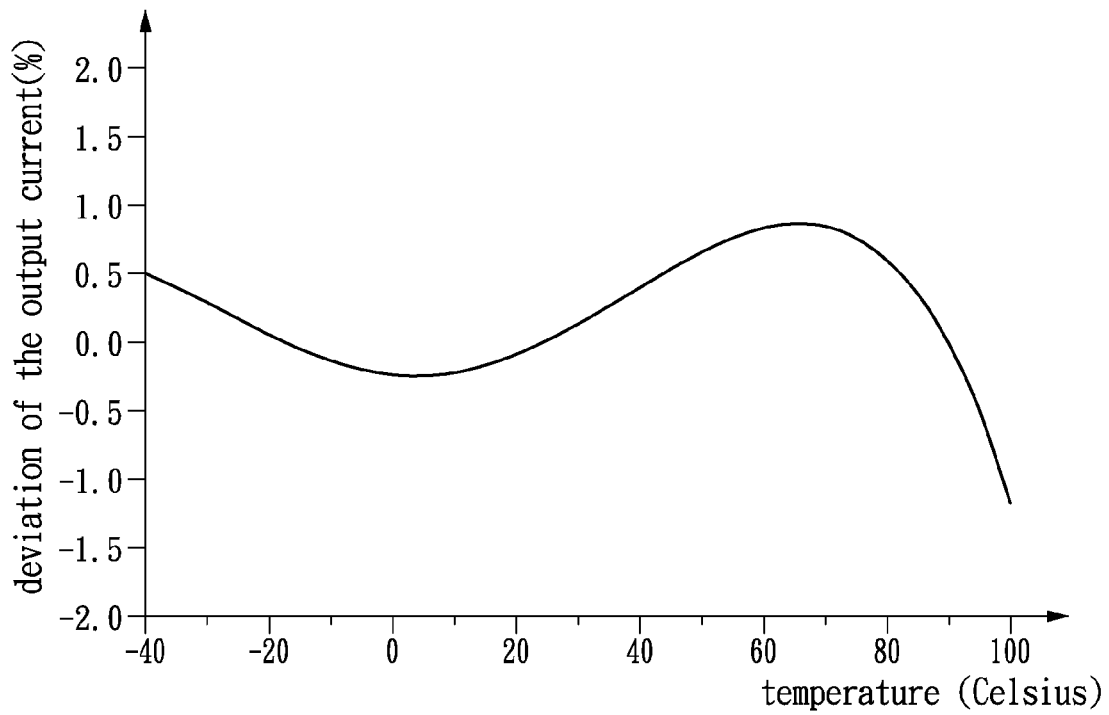

Please referring to FIGS. 4A-4C, which show simulation curve diagrams corresponding to FIG. 3; an abscissa in each of the Figs represents a temperature, and a range of the temperature is set from −40□ to +90□ or +100□. In FIG. 4A, an ordinate represents the current gain ($\beta$) with a surrounding temperature, and the value of the current gain ($\beta$) decreases with an increase of the surrounding temperature. In FIG. 4B, an ordinate represents the reference voltage VREF, and the reference voltage VREF increases with an increase of the surrounding temperature, and by adjusting the resistor values of the resistors R6 and R7, the reference voltage VREF is able to have a characteristic of a positive temperature coefficient. Since the feedback voltage VF and the base-emitter voltage VBE4 counterbalance each other, a curve of the reference voltage VREF may be seen as a curve of the output voltage VO. In addition, the closer the absolute value of the slope of the curve in FIG. 4B gets to the absolute value of the slope of the curve in FIG. 4A, then the temperature compensation effect of the output current IC of RF power amplifier 300 is better. In FIG. 4C, an ordinate represents the output current IC, and the output current IC is able to be close to have a characteristic of the zero temperature coefficient; which means, the output current IC remains stable with a temperature variation.

Referring to Equations (6)-(11), if an advancing manufacture process which is able to make the temperature coefficient of the current gain ($\beta$) to be close to the zero temperature coefficient, and the designer is able to adjust the resistor values of the resistors R6 and R7 so as to make the reference voltage VREF to be close to or equal to be a voltage with a zero temperature coefficient, and to provide an input current IB with a close to zero temperature coefficient, and further to make the output current IC or the output power not float with the temperature variation.

In another embodiment, an output-stage circuit 130 may further include a first inductor L1, a first capacitor C1, and a second capacitor C2. A terminal of the first capacitor C1 is coupled to a base of the fourth transistor Q4, and another terminal is coupled to the RF input signal RFIN. The first inductor L1 is coupled between a system voltage VCC and a collector of the fourth transistor Q4. A terminal of the second capacitor C2 is coupled to the collector of the fourth transistor Q4, and another terminal of the second capacitor C2 outputs a RF output signal RFOUT.

When the RF power amplifier 300 have not started receiving the RF input signal RFIN yet, the first inductor L1 shows a low-impedance status, such as a short circuit, to a DC signal; on the other hand, the capacitors C1 and C2 show a high-impedance status, such as an open circuit, to the DC signal. When the RF power amplifier 300 starts receiving the RF input signal RFIN, the first inductor L1 shows the high-impedance status, such as the open circuit, to a high-frequency signal; on the other hand, the capacitors C1 and C2 show the low-impedance status, such as the short circuit, to the high-frequency signal. Based on the above, the RF power amplifier 300 is able to work well under both DC or AC working modes.

Figure 5:
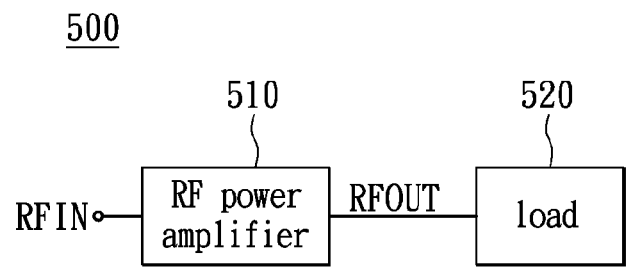
FIG. 5 shows an block diagram of an electronic system according to the embodiment of the instant disclosure.

Referring to FIG. 5, FIG. 5 shows an isolate diagram of an electronic system 500 according to another embodiment of the instant disclosure. The electronic system 500 includes a RF power amplifier 510 and a load 520. The RF power amplifier 510 receives a RF input signal RFIN and outputs a RF output signal RFOUT to the load 520; which means, after the RF power amplifier 510 coupled to the system voltage, there is a stable output power outputted to the load 520. The RF power amplifier 510 may be one of the RF power amplifiers 100, 200, or 300 in the FIGS. 1-3, for a use of providing the stable output power to the load 520. The electronic system may be any kind of system inside of an electronic device, and the electronic device may be a hand-held device or a portable device.

Figure 6:
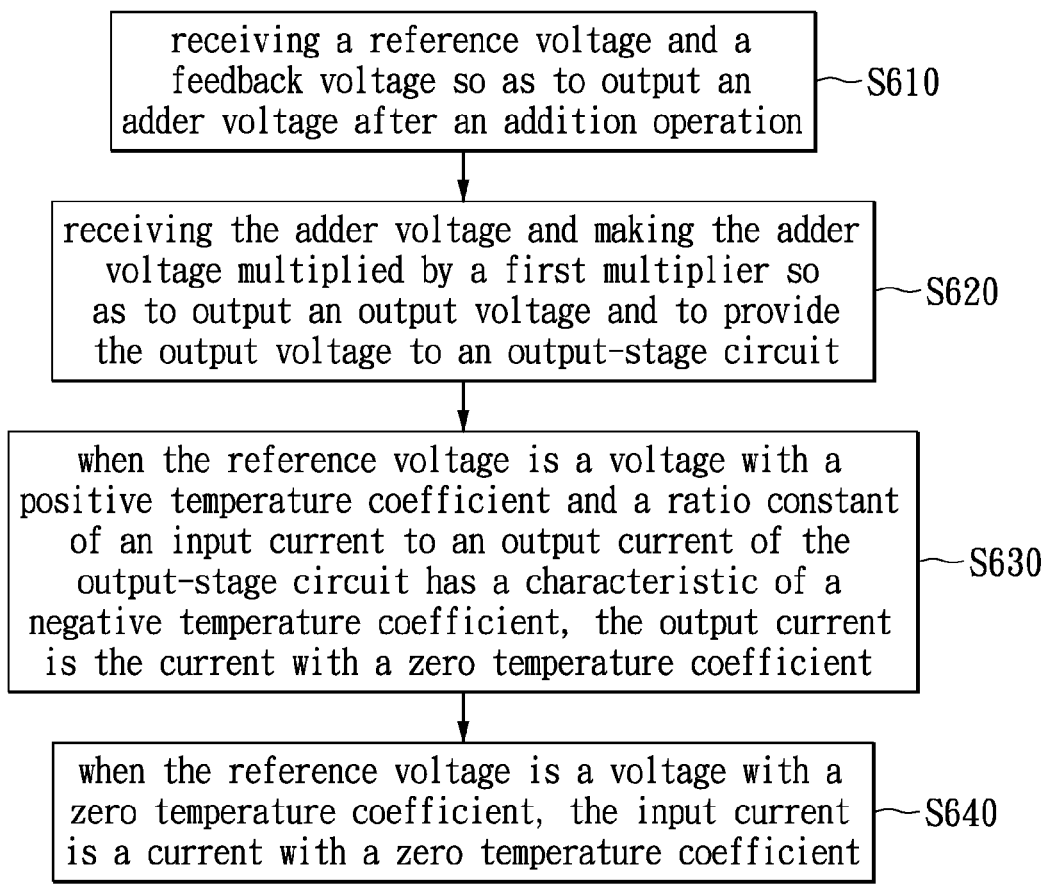
FIG. 6 shows a flow chart of a temperature compensation method according to the embodiments of the instant disclosure.

Referring to FIG. 6, FIG. 6 shows a flow chart of a temperature compensation method according to the embodiments of the instant disclosure. The method is able to be operated in any of the RF power amplifiers shown in FIGS. 1-3; therefore, please also referring to FIGS. 1-3 for further understanding. The method includes steps as follows: receiving a reference voltage and a feedback voltage so as to output an adder voltage after an addition operation (S610); receiving the adder voltage and making the adder voltage be multiplied by a first multiplier factor so as to output an output voltage and to provide the output voltage to an output-stage circuit (S620); when the reference voltage is a voltage with a positive temperature coefficient and a ratio constant of an input current to an output current of the output-stage circuit has a characteristic of a negative temperature coefficient, the output current is the current with a zero temperature coefficient (S630); when the reference voltage is a voltage with a zero temperature coefficient, the input current is a current with a zero temperature coefficient (S640). Among the above, the adder voltage is a sum of the reference voltage multiplied by the first ratio and the feedback voltage multiplied by the second ratio.

The steps described in FIG. 6 are simply for a need to instruct easily; therefore, sequence of the steps is not used to limit the embodiment of the instant disclosure.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A RF power amplifier, comprising:
    an adder circuit, having a first ratio and a second ratio, receiving a reference voltage and a feedback voltage so as to output an adder voltage after an operation, wherein the feedback voltage is a voltage with a negative temperature coefficient, and the reference voltage is a sum of a first voltage with a positive temperature coefficient and a second voltage with a negative temperature coefficient, and the adder voltage is a sum of the reference voltage multiplied by the first ratio and the feedback voltage multiplied by the second ratio;
    an output-stage circuit, coupled to the adder circuit, and used for providing the feedback voltage; and
    a differential circuit, electrically coupled to the adder circuit, having a first multiplier factor, making the adder voltage received be multiplied with the first multiplier factor so as to provide the output voltage to the output-stage circuit;
    wherein when the reference voltage is a voltage with a zero temperature coefficient, an input current will be a current with a zero temperature coefficient; or, when the reference voltage is a voltage with a positive temperature coefficient and a ratio constant of an input current to an output current of the output-stage circuit has a characteristic of negative temperature coefficient, the output current is a current with a zero temperature coefficient.

2. The RF power amplifier according to claim 1, wherein the first ratio is equal to the second ratio, and the first multiplier factor is a reciprocal of the first ratio or a reciprocal of the second ratio.

3. The RF power amplifier according to claim 1, further comprising:
    a reference voltage generating circuit, electrically connected to the adder circuit, providing the reference voltage to the adder circuit.

4. The RF power amplifier according to claim 1, wherein the differential circuit comprising:
    an amplifier, having a positive input terminal and a negative input terminal, wherein the positive input terminal is coupled to the adder circuit to receive the adder voltage; an output terminal of the amplifier provides the output voltage to the output-stage circuit;
    a first resistor, wherein a terminal of first resistor is coupled to a ground voltage, and another terminal of the first resistor is coupled to the negative input terminal of the amplifier; and
    a second resistor, wherein a terminal of the second resistor is coupled to the negative input terminal of the amplifier, and another terminal of the second resistor is coupled to an output terminal of the amplifier;
    wherein a first multiplier factor is a resistor value of the second resistor divided by a resistor value of the first resistor.

5. The RF power amplifier according to claim 1, wherein the adder circuit comprising:
    a third resistor, wherein a terminal of the third resistor receives the reference voltage; and
    a fourth resistor, wherein a terminal of the fourth resistor is coupled to the third resistor, and another terminal receives the feedback voltage;
    wherein the first ratio is equal to a resistor value of the fourth resistor divided by a total resistor value, and the second ratio is equal to a resistor value of the third resistor divided by the total resistor value, wherein the total resistor value is a sum of the resistor value of the third resistor and the resistor value of the fourth resistor.

6. The RF power amplifier according to claim 3, wherein the reference voltage generating circuit comprising:
    a first transistor, wherein an emitter of the first transistor is coupled to a ground voltage;
    a second transistor, wherein a base of the second transistor is coupled to the base of the first transistor;
    a fifth resistor, wherein a terminal of the fifth resistor is coupled to a first node, and another terminal of the fifth resistor is coupled to a collector and the base of the first transistor, wherein the first node outputs the reference voltage to the adder circuit;
    a sixth resistor, wherein a terminal of the sixth resistor is coupled to the first node, and another terminal of the sixth resistor is coupled to the collector of the second transistor;
    a seventh resistor, wherein a terminal of the seventh resistor is coupled to an emitter of the second transistor, and another terminal is coupled to the ground voltage, and the seventh resistor is used to generate a base-emitter voltage-difference current with a positive temperature coefficient, wherein the temperature coefficient of the reference voltage is adjusted through adjusting the resistor values of the sixth resistor or the seventh resistor;
    a third transistor, wherein a base of the third transistor is coupled to another terminal of the sixth resistor, and a collector of the third transistor is coupled to the first node, and an emitter of the third transistor is coupled to the ground voltage, wherein the base-emitter voltage of the third transistor is the second voltage; and a current source, wherein a terminal of the current source is coupled to a system voltage, and another terminal of the current source is coupled to the first node, and a current of the current source flows from the system voltage to the first node, wherein the first voltage is equal to the base-emitter voltage-difference current multiplied by the resistor value of the sixth resistor.

7. The RF power amplifier according to claim 1, wherein the output-stage circuit comprising:
   a fourth transistor, wherein a collector of the fourth transistor is coupled to a system voltage, and an emitter of the fourth transistor is coupled to the ground voltage, and a base of the fourth transistor is coupled to the output voltage,
   wherein a ratio constant of an output current to an input current of the fourth transistor is a current gain with a negative temperature coefficient, and the base-emitter voltage of the fourth transistor is the feedback voltage.

8. The RF power amplifier according to claim 4, wherein the amplifier comprising:
   a fifth transistor, wherein a gate of the fifth transistor is the positive input terminal, used to receive the adder voltage, and a drain of the fifth transistor is coupled to a system voltage;
   a sixth transistor, wherein a gate of the sixth transistor is the negative input terminal, coupled to a terminal of the second resistor, and a source of the sixth transistor is coupled to a source of the fifth transistor;
   a seventh transistor, wherein a drain of the seventh transistor is coupled to the source of the fifth transistor, and a base of the transistor is coupled to the ground voltage, wherein the seventh transistor is a depletion-type transistor;
   an eighth resistor, wherein a terminal of the eighth resistor is coupled to the source of the seventh transistor, another terminal is coupled to the ground voltage;
   an eighth transistor, wherein a gate of the eighth transistor is coupled to a drain of the sixth transistor, and a drain of the eighth transistor is coupled to the system voltage, wherein the eighth transistor is a depletion-type transistor;
   a ninth resistor, wherein a terminal of the ninth resistor is coupled to a source of the eighth transistor, while another terminal of the ninth resistor is coupled to the drain of the sixth transistor; and
   a ninth transistor, wherein a base of the ninth transistor is coupled to another terminal of the ninth resistor, and a drain of the ninth transistor is coupled to the system voltage, and a source of the ninth transistor provides the output voltage to the output-stage circuit, wherein the ninth transistor is a depletion-type transistor, used as a buffer transistor to isolate interference.

9. An electronic system, comprising:
   a RF power amplifier according to claim 1, receiving a RF input signal and outputs a RF output signal; and
   a load, coupled to the RF power amplifier, receiving the RF output signal outputted by the RF power amplifier.

10. The electronic system according to claim 9, wherein the first ratio is equal to the second ratio, and the first multiplier factor is a reciprocal of the first ratio or a reciprocal of the second ratio.

11. The electronic system according to claim 9, the RF power amplifier further comprising:
    a reference voltage generating circuit, electrically connected to the adder circuit, providing the reference voltage to the adder circuit.

12. The electronic system according to claim 9, wherein the differential circuit comprising:
    an amplifier, having a positive input terminal and a negative input terminal, wherein the positive input terminal is coupled to the adder circuit to receive the adder voltage; an output terminal of the amplifier provides the output voltage to the output-stage circuit;
    a first resistor, wherein a terminal of first resistor is coupled to a ground voltage, and another terminal of the first resistor is coupled to the negative input terminal of the amplifier; and
    a second resistor, wherein a terminal of the second resistor is coupled to the negative input terminal of the amplifier, and another terminal of the second resistor is coupled to an output terminal of the amplifier;
    wherein a first multiplier factor is a resistor value of the second resistor divided by a resistor value of the first resistor.

13. The electronic system according to claim 9, wherein the adder circuit comprising:
    a third resistor, wherein a terminal of the third resistor receives the reference voltage: and
    a fourth resistor, wherein a terminal of the fourth resistor is coupled to the third resistor, and another terminal receives the feedback voltage;
    wherein the first ratio is equal to a resistor value of the fourth resistor divided by a total resistor value, and the second ratio is equal to a resistor value of the third resistor divided by the total resistor value, wherein the total resistor value is a sum of the resistor value of the third resistor and the resistor value of the fourth resistor.

14. The electronic system according to claim 11, wherein the reference voltage generating circuit comprising:
    a first transistor, wherein an emitter of the first transistor is coupled to a ground voltage;
    a second transistor, wherein a base of the second transistor is coupled to the base of the first transistor;
    a fifth resistor, wherein a terminal of the fifth resistor is coupled to a first node, and another terminal of the fifth resistor is coupled to a collector and the base of the first transistor, wherein the first node outputs the reference voltage to the adder circuit;
    a sixth resistor, wherein a terminal of the sixth resistor is coupled to the first node, and another terminal of the sixth resistor is coupled to the collector of the second transistor;
    a seventh resistor, wherein a terminal of the seventh resistor is coupled to an emitter of the second transistor, and another terminal is coupled to the ground voltage, and the seventh resistor is used to generate a base-emitter voltage-difference current with a positive temperature coefficient, wherein the temperature coefficient of the reference voltage is adjusted through adjusting the resistor values of the sixth resistor or the seventh resistor;
    a third transistor, wherein a base of the third transistor is coupled to another terminal of the sixth resistor, and a collector of the third transistor is coupled to the first node, and an emitter of the third transistor is coupled to the ground voltage, wherein the base-emitter voltage of the third transistor is the second voltage; and
    a current source, wherein a terminal of the current source is coupled to a system voltage, and another terminal of the current source is coupled to the first node, and a current of the current source flows from the system voltage to the first node, wherein the first voltage is equal to the base-emitter voltage-difference current multiplied by the resistor value of the sixth resistor.

15. The electronic system according to claim 9, wherein the output-stage circuit comprising:
a fourth transistor, wherein a collector of the fourth transistor is coupled to a system voltage, and an emitter of the fourth transistor is coupled to the ground voltage, and a base of the fourth transistor is coupled to the output voltage,
wherein a ratio constant of an output current to an input current of the fourth transistor is a current gain with a negative temperature coefficient, and the base-emitter voltage of the fourth transistor is the feedback voltage.

16. The electronic system according to claim 12, wherein the amplifier comprising:
a fifth transistor, wherein a gate of the fifth transistor is the positive input terminal, used to receive the adder voltage, and a drain of the fifth transistor is coupled to a system voltage;
a sixth transistor, wherein a gate of the sixth transistor is the negative input terminal, coupled to a terminal of the second resistor, and a source of the sixth transistor is coupled to a source of the fifth transistor;
a seventh transistor, wherein a drain of the seventh transistor is coupled to the source of the fifth transistor, and a base of the transistor is coupled to the ground voltage, wherein the seventh transistor is a depletion-type transistor;
an eighth resistor, wherein a terminal of the eighth resistor is coupled to the source of the seventh transistor, another terminal is coupled to the ground voltage;
an eighth transistor, wherein a gate of the eighth transistor is coupled to a drain of the sixth transistor, and a drain of the eighth transistor is coupled to the system voltage, wherein the eighth transistor is a depletion-type transistor;
a ninth resistor, wherein a terminal of the ninth resistor is coupled to a source of the eighth transistor, while another terminal of the ninth resistor is coupled to the drain of the sixth transistor; and
a ninth transistor, wherein a base of the ninth transistor is coupled to another terminal of the ninth resistor, and a drain of the ninth transistor is coupled to the system voltage, and a source of the ninth transistor provides the output voltage to the output-stage circuit, wherein the ninth transistor is a depletion-type transistor, used as a buffer transistor to isolate interference.

17. A temperature compensation method for a RF power amplifier, comprising:
receiving a reference voltage and a feedback voltage so as to output an adder voltage after an addition operation; and
receiving the adder voltage and making the adder voltage be multiplied by a first multiplier factor so as to output an output voltage and to provide the output voltage to an output-stage circuit;
wherein when the reference voltage is a voltage with a positive temperature coefficient and a ratio constant of an input current to an output current of the output-stage circuit has a characteristic of a negative temperature coefficient, the output current is the current with a zero temperature coefficient.

18. The temperature compensation method according to claim 17, the RF power amplifier comprising:
an adder circuit, having a first ratio and a second ratio, receiving a reference voltage and a feedback voltage so as to output an adder voltage after an operation, wherein the feedback voltage is a voltage with a negative temperature coefficient, and the reference voltage is a sum of a first voltage with a positive temperature coefficient and a second voltage with a negative temperature coefficient, and the adder voltage is a sum of the reference voltage multiplied by the first ratio and the feedback voltage multiplied by the second ratio;
an output-stage circuit, coupled to the adder circuit, and used for providing the feedback voltage; and
a differential circuit, electrically coupled to the adder circuit, having a first multiplier factor, making the adder voltage received be multiplied with the first multiplier factor so as to provide the output voltage to the output-stage circuit;
wherein when the reference voltage is a voltage with a zero temperature coefficient, an input current will be a current with a zero temperature coefficient; or, when the reference voltage is a voltage with a positive temperature coefficient and a ratio constant of an input current to an output current of the output-stage circuit has a characteristic of negative temperature coefficient, the output current is a current with a zero temperature coefficient.

19. The temperature compensation method according to claim 18, the RF power amplifier further comprising:
a reference voltage generating circuit, electrically connected to the adder circuit, providing the reference voltage to the adder circuit.

20. The temperature compensation method according to claim 18, wherein the first ratio is equal to the second ratio, and the first multiplier factor is a reciprocal of the first ratio or a reciprocal of the second ratio.

* * * * *